(12) United States Patent
Zhou et al.

(10) Patent No.: US 10,121,548 B2
(45) Date of Patent: Nov. 6, 2018

(54) NONVOLATILE MEMORIES AND READING METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yao Zhou, Shanghai (CN); Hao Ni, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/815,339

(22) Filed: Nov. 16, 2017

(65) Prior Publication Data

US 2018/0144803 A1     May 24, 2018

(30) Foreign Application Priority Data

Nov. 18, 2016  (CN) .......................... 2016 1 1037221

(51) Int. Cl.
*G11C 16/24* (2006.01)
*G11C 16/28* (2006.01)
*G11C 16/30* (2006.01)

(52) U.S. Cl.
CPC .............. *G11C 16/24* (2013.01); *G11C 16/28* (2013.01); *G11C 16/30* (2013.01)

(58) Field of Classification Search
CPC ......... G11C 16/24; G11C 16/28; G11C 16/30; G11C 13/004; G11C 2103/0054; G11C 13/0002

See application file for complete search history.

(56) References Cited

U.S. PATENT DOCUMENTS

2003/0026133 A1   2/2003   Michael et al.
2010/0208525 A1   8/2010   Hanyu et al.
(Continued)

OTHER PUBLICATIONS

The European Patent Office (EPO) The Extended European Search Report for 17202046.3 dated Mar. 21, 2018 10 Pages.

*Primary Examiner* — David Lam
(74) *Attorney, Agent, or Firm* — Anova Law Group, PLLC

(57) ABSTRACT

A nonvolatile memory includes a first array bank coupled to a first bit-line, a second array bank coupled to a second bit-line, a pre-charging circuit, a first selection circuit, a second selection circuit, and a sense amplifier. An address enable signal sent to the first selection circuit controls whether the pre-charging circuit needs to pre-charge the first bit-line and the second bit-line. The sense amplifier is configured to compare a first voltage from the first output terminal of the pre-charging circuit with a second voltage from the second output terminal of the pre-charging circuit to obtain a result indicating data information stored in the first array bank or in the second array bank. The second selection circuit is configured to connect a reference current to the first input terminal or the second input terminal of the sense amplifier based on a first word-line signal and a second word-line signal.

19 Claims, 4 Drawing Sheets

(56) References Cited

U.S. PATENT DOCUMENTS

2014/0104933 A1* 4/2014 Yamahira ............... G11C 7/04
 365/148
2015/0340098 A1 11/2015 Maayan et al.

* cited by examiner

NONVOLATILE MEMORIES AND READING METHODS THEREOF

CROSS-REFERENCES TO RELATED APPLICATIONS

This application claims the priority of Chinese Patent Application No. CN201611037221.1, filed on Nov. 18, 2016, the entire content of which is incorporated herein by reference.

FIELD OF THE DISCLOSURE

The present disclosure generally relates to the field of memory design and, more particularly, relates to nonvolatile memories and reading methods thereof.

BACKGROUND

With the rapid development of electronic information technology, people have increasing demands on the speed of electronic products. The speed of electronic products has become one of the most important indicators for electronic circuits. Therefore, more and more challenges have been posed for circuit designers.

Nonvolatile memory (NVM) is a commonly-used memory. Specifically, an NVM may allow data to be stored even after power failure. Using flash memory as an example, the design of high-speed flash memory faces increasing demands on the read speed of the memory. The data read time for an NVM (for example, a flash memory) usually includes four parts associated with address decoding, bit-line pre-charging, memory-cell current amplifying, and data comparison and output, respectively. Problems arise, however, because the NVM has a relatively long data read time. This may not meet the high-speed application requirements for NVM. Therefore, the data read time for the NVM needs to be shortened in order to improve the operation speed of the NVM.

Among the above four parts of the data read time for an NVM, the time period associated with address decoding as well as the time period associated with data comparison and output may account for a small portion of the overall data read time. Moreover, the time period associated with memory-cell current amplifying is mainly process dependent, and may hardly be shortened. Therefore, among the four parts of the data read time for an NVM, the time period associated with bit-line pre-charging may be a part that can be possibly shortened.

The disclosed NVMs and reading methods thereof are directed to solve one or more problems set forth above and other problems in the art.

BRIEF SUMMARY OF THE DISCLOSURE

One aspect of the present disclosure includes a nonvolatile memory (NVM). The NVM includes a first array bank coupled to a first bit-line and a second array bank coupled to a second bit-line. Each of the first array bank and the second array bank includes a plurality of memory cells. The NVM also includes a pre-charging circuit, a first selection circuit, a second selection circuit, and a sense amplifier. In response to an address enable signal to pre-charge the first bit-line and the second bit-line, the first selection circuit is configured to connect a first output terminal of the pre-charging circuit to the first bit-line and a second output terminal of the pre-charging circuit to the second bit-line, and in response to an address enable signal to disable pre-charging the first bit-line and the second bit-line, the first selection circuit is configured to disconnect the first bit-line from the first output terminal of the pre-charging circuit and the second bit-line from the second output terminal of the pre-charging circuit. The sense amplifier includes a first input terminal to receive a first voltage from the first output terminal of the pre-charging circuit and a second input terminal to receive a second voltage from the second output terminal of the pre-charging circuit, and is configured to compare the first voltage with the second voltage to obtain a result indicating data information stored in the first array bank or in the second array bank. The second selection circuit is configured to connect a reference current to the first input terminal or the second input terminal of the sense amplifier based on a first word-line signal and a second word-line signal.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
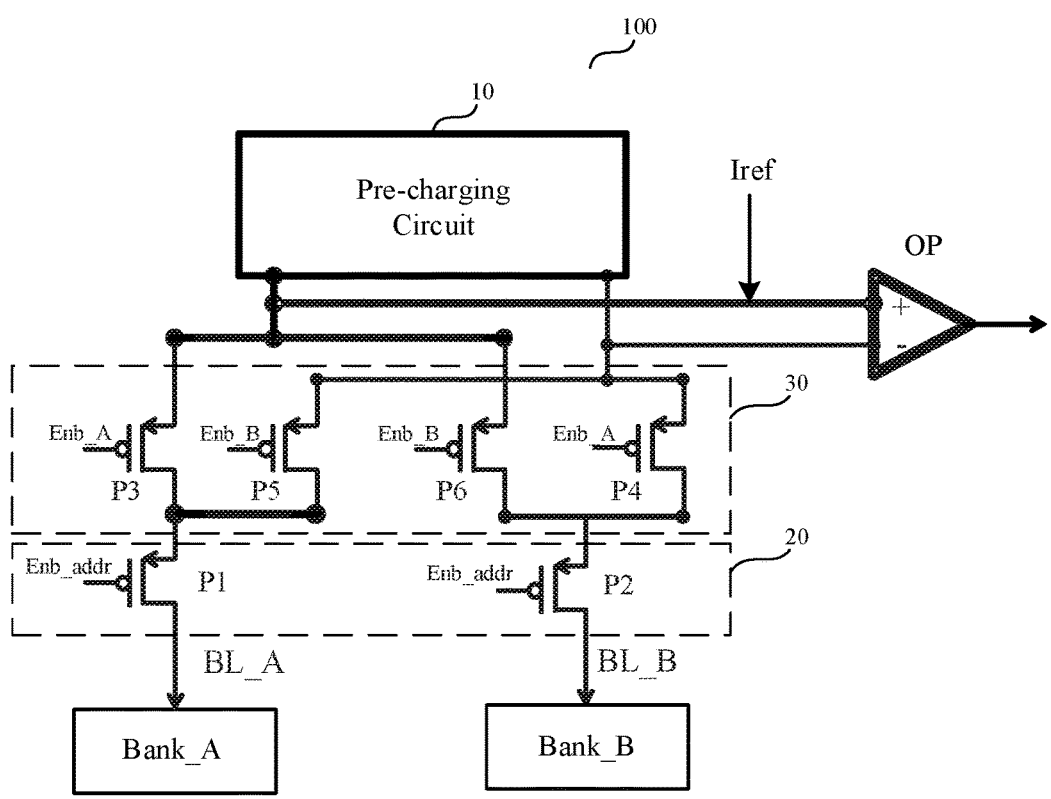
FIG. 1 illustrates a schematic diagram of a nonvolatile memory (NVM)

FIG. 1 illustrates a schematic diagram of a conventional NVM 100. Referring to FIG. 1, the NVM 100 includes two array banks: array bank Bank_A and array bank Bank_B. When reading the data information stored in the array bank Bank_A, the array bank Bank_B is used as a pseudo array bank corresponding to the array bank Bank_A, and similarly, and when reading the data information stored in the array bank Bank_B, the array bank Bank_A is used as a pseudo array bank corresponding to the array bank Bank_B. As such, an effective way to overcome noise is provided.

Further, the NVM 100 includes a pre-charging circuit 10, a first selection circuit 20, a second selection circuit 30, and a sense amplifier OP. When an address enable signal Enb_addr turns on the metal-oxide-semiconductor (MOS) transistors P1 and P2 of the first selection circuit 20, and a first word-line signal Enb_A and a second word-line signal Enb_B simultaneously turn on the MOS transistors P3 and P4 of the second selection circuit 30 but turn off the MOS transistors P5 and P6 of the second selection circuit 30, the array bank Bank_A is controlled to read out the data information stored in the array bank Bank_A. The pre-charging circuit 10 charges the first bit-line BL_A that is coupled to the array bank Bank_A, and also charges the second-bit line BL_B that is coupled to the array bank Bank_B. Moreover, the sense amplifier OP compares a reference current $I_{ref}$ with a current generated on the first bit-line BL_A and then outputs a comparison result indicating the information stored in the array bank Bank_A. Practically, the pre-charging time of the bit-line from the pre-charging circuit 10 accounts for approximately ⅓ to ½ of the overall data read time of the NVM 100.

The NVM 100 is a design based on a dual array bank structure. Therefore, controlled by the address enable signal Enb_addr, the first selection circuit 20 is configured to selectively charge one or both of the first bit-line BL_A and the second bit-line BL_B of the pre-charging circuit 10. Moreover, controlled by the first word-line signal Enb_A and the second word-line signal Enb_B, the second selection circuit 30 is configured to selectively read the data information stored in the array bank Bank_A or in the array bank Bank_B.

However, in practice, the voltage of the bit-line of a high speed NVM is usually at a high level. Accordingly, the selection devices in the first selection circuit 20 and the second selection circuit 30 are often P-type metal-oxide-semiconductor (PMOS) transistors. In order to turn on such a PMOS transistor, the source voltage of the PMOS transistor needs to be higher than a threshold voltage $V_{th}$. Therefore, the process to pre-charge the bit-lines using the pre-charging circuit 10 may only be effectively started until each PMOS transistor is turned on. As such, the overall speed to pre-charge the bit-line may be affected. Further, the more the selection devices are present between the pre-charging circuit 10 and the bit-lines, the slower the bit-line pre-charging speed is obtained. Therefore, the design of the NVM 100 may cause the bit-line pre-charging time approximately ⅓ to ½ of the overall data read time of the NVM 100, thus leading to a relatively long data read time for the NVM 100.

The present disclosure provides an NVM. The NVM includes a first array bank and a second array bank with each including a plurality of memory cells. The NVM also includes a pre-charging circuit, a sense amplifier, a first selection circuit, and a second selection circuit. Further, a first input terminal and a second input terminal of the sense amplifier are coupled to the first array bank and the second array bank, respectively. A reference current is connected to the first input terminal and the second input terminal of the sense amplifier through the structurally-symmetric second selection circuit. Moreover, the reference current flows only into the active array bank between the first array bank and the second array bank. Specifically, the active array bank between the first array bank and the second array bank refers to the array bank in the first array bank and the second array bank that needs to be read out. At a given time, the reference current may flow exclusively into the first array bank or exclusively into the second array bank depending on which array bank needs to be read out.

Unlike conventional NVMs, the disclosed NVM eliminates the array bank selection circuit for selecting the array bank to be read out from the first array bank and the second array bank, and only retains the bit-line pre-charging selection circuit for selectively pre-charging the first bit-line and/or the second bit-line. In conventional NVMs, the array bank selection circuit and the bit-line pre-charging selection circuit are arranged in series in the electric circuit diagram (referring to FIG. 1). Therefore, the selection devices (such as PMOS transistors) in the electric circuit of conventional NVMs may include multiple levels. According to the disclosed NVMs, by eliminating the array bank selection circuit, the number of the levels of the selection devices (such as PMOS transistors) in the pre-charging circuit path is reduced by one such that the pre-charging process for the first bit-line and/or the second bit-line may be greatly improved.

Figure 2:
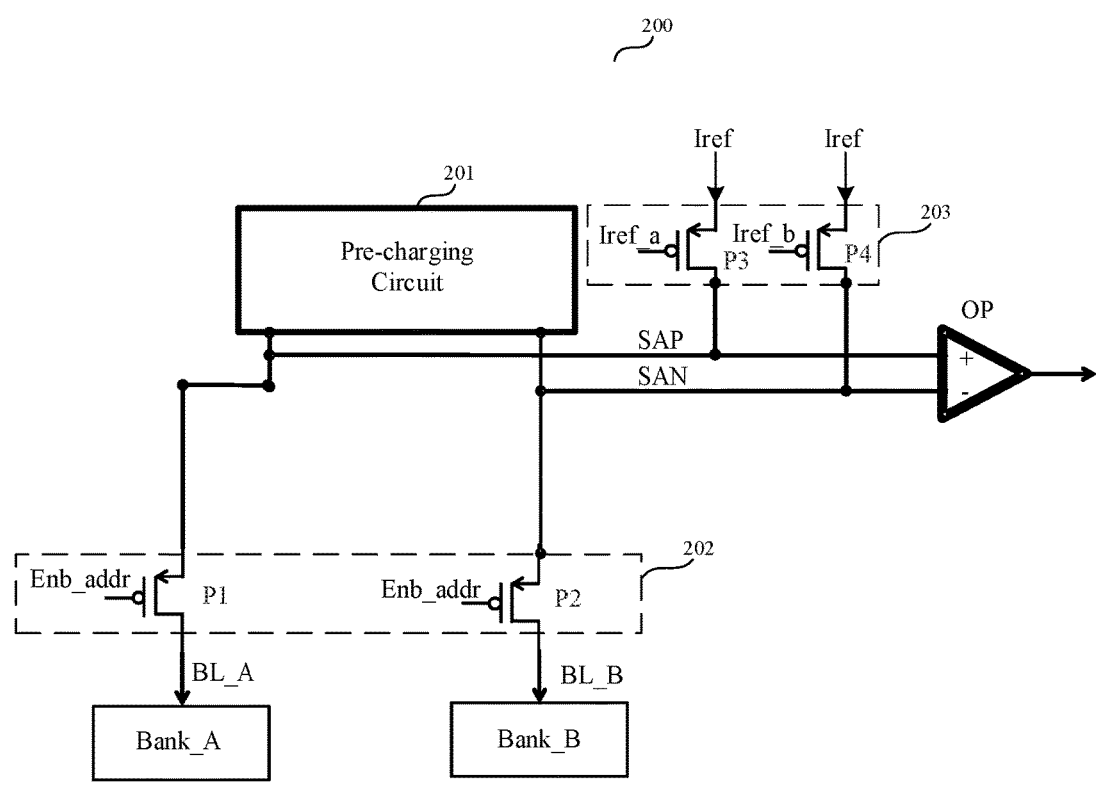
FIG. 2 illustrates a schematic structural diagram of an exemplary NVM consistent with various embodiments of the present disclosure.

FIG. 2 illustrates a schematic structural diagram of an NVM consistent with various embodiments of the present disclosure. Referring to FIG. 2, the NVM 200 may include a first array bank Bank_A and a second array bank Bank_B. The first array bank Bank_A and the second array bank Bank_B may each include a plurality of memory cells. The first array bank Bank_A may be coupled to a first bit-line BL_A and the second array bank Bank_B may be coupled to a second bit line BL_B. When one of the first bank Bank_A and the second bank Bank_B is controlled to be read out, the other one of the first bank Bank_A and the second bank Bank_B may be used as the pseudo array bank for the read operation. The pseudo array bank may provide an equivalent load of the NVM 200 for the array bank to be read out in order to simulate the leakage current of the NVM 200. For example, when the data information stored in the first array bank Bank_A is controlled to be read out, the second array bank Bank_B may serve as a pseudo array bank for the first array bank Bank_A; similarly, when the data information stored in the second array bank Bank_B is controlled to be read out, the first array bank Bank_A may serve as a pseudo array bank for the second array bank Bank_B.

The NVM 200 may also include a pre-charging circuit 201, a first selection circuit 202, a sense amplifier OP, and a second selection circuit 203.

In response to an address enable signal Enb_addr that enables pre-charging the first bit-line BL_A and the second bit-line BL_B, the first selection circuit 202 may be configured to connect a first output terminal of the pre-charging circuit 201 to the first bit-line BL_A and a second output terminal of the pre-charging circuit 201 to the second bit-line BL_B to allow the pre-charging circuit charge the first bit-line BL_A and the second bit-line BL_B. Alternatively, in response to an address enable signal Enb_addr that disables pre-charging the first bit-line BL_A and the second bit-line BL_B, the first selection circuit 202 may be configured to disconnect the connection between the first output terminal of the pre-charging circuit 201 and the first bit-line BL_A and the connection between the second output terminal of the pre-charging circuit 201 and the second bit-line BL_B. That is, when pre-charging the first bit-line BL_A and the second bit-line BL_B is required, the address enable signal Enb_addr may control the first selection circuit 202 to connect a first output terminal of the pre-charging circuit 201 to the first bit-line BL_A and to connect a second output terminal of the pre-charging circuit 201 to the second bit-line BL_B. When pre-charging the first bit-line BL_A and the second bit-line BL_B is completed or not required, the address enable signal Enb_addr may control the first selection circuit 202 to disconnect the first bit-line BL_A from the first output terminal of the pre-charging circuit 201 and also disconnect the second bit-line BL_B from the second output terminal of the pre-charging circuit 201.

A first input terminal of the sense amplifier OP may be coupled to the first output terminal of the pre-charging circuit 201 to receive a first voltage SAP, and a second input terminal of the sense amplifier OP may be coupled to the second output terminal of the pre-charging circuit 201 to receive a second voltage SAN. Further, the sense amplifier OP may be configured to compare the first voltage SAP with the second voltage SAN and thus obtain a comparison result. The comparison result may indicate the data information stored in the first array bank Bank_A or in the second array bank Bank_B, depending on which array bank is controlled to be read out.

The second selection circuit 203 may be configured to connect a reference current to either the first input terminal or the second input terminal of the sense amplifier OP based on a first word-line signal $I_{ref\_A}$ and a second word-line signal $I_{ref\_B}$.

For illustration purpose, the following description is based on an operation to read the data information stored in the first array bank Bank_A.

When reading out the data information stored in the first array bank Bank_A, the address enable signal Enb_addr may allow the first output terminal of the pre-charging circuit 201 to be connected to the first bit-line BL_A and the second output terminal of the pre-charging circuit 201 to be connected to the second bit-line BL_B. As such, the pre-charging circuit 201 may be able to charge the first bit-line BL_A and the second bit-line BL_B. In addition, the first word-line signal $T_{ref\_A}$ and the second word-line signal $T_{ref\_B}$ may allow the reference current to flow into the first input terminal of the sense amplifier OP through the second selection circuit 203 such that the reference current may only flow into the first bit-line BL_A.

Further, in one embodiment, it is assumed that the pre-charging circuit 201 may charge the first bit-line BL_A and the second bit-line BL_B to 1 V, when the reference current is not connected to the first input terminal nor connected to the second input terminal of the sense amplifier OP. Therefore, both the first voltage SAP and the second voltage SAN may be 1 V. Moreover, the reference current in the NVM is assumed to be 2 μA.

Further, when the data information stored in the first array bank Bank_A is "1", the current in the first bit-line BL_A is assumed to be 5 μA. That is, the current in the first bit-line BL_A is greater than the reference current. In addition, in the circuit path between the coupled first input terminal of the sense amplifier OP and the first bit-line BL_A of the first array bank Bank_A, a certain impedance may exist. Therefore, the first voltage SAP may be pulled down to a lower value. For example, the first voltage SAP may be pulled down to 900 mV. The sense amplifier OP may compare the first voltage SAP with the second voltage SAN and obtain a comparison result indicating that the data information stored in the first array bank Bank_A is "1".

When the data information stored in the first array bank Bank_A is "0", the current in the first bit-line BL_A is assumed to be 0 μA. Because the current in the first bit-line BL_A is smaller than the reference current, the first voltage SAP may thus be raised. For example, the first voltage SAP may be increased to 1.1 V. The sense amplifier OP may compare the first voltage SAP with the second voltage SAN and obtain a comparison result indicating that the data information stored in the first array bank Bank_A is "0".

Based on the analysis of the conventional NVM 100 (referring to FIG. 1), the selection devices in the NVM 100 may include two levels: a bit-line selection level and an array bank selection level. The two levels of selection devices are arranged in series, and thus may significantly restrict the improvement of the speed to pre-charge the bit-lines. Moreover, regardless of how well the dimensions of the selection devices are controlled, the speed of pre-charging may not be significantly improved because of the two consecutive levels of selection devices. According to the disclosed NVM, a key component (i.e. the array bank selection level) that may hold back the pre-charging speed is removed from the charging path between the pre-charging circuit 201 and the bit-line, and only the incompressible component (i.e. the bit-line selection level) in the path may be kept. As such, the bit-line pre-charging time in the disclosed NVM 200 may be reduced by approximately 0.7 ns to 1.2 ns. For a memory with a typical data read time of about 10 ns, the reduced portion of the bit-line pre-charging time is approximately 10% of the data read time. Therefore, the data read time of the disclosed NVM 200 may be effectively reduced.

Figure 3:
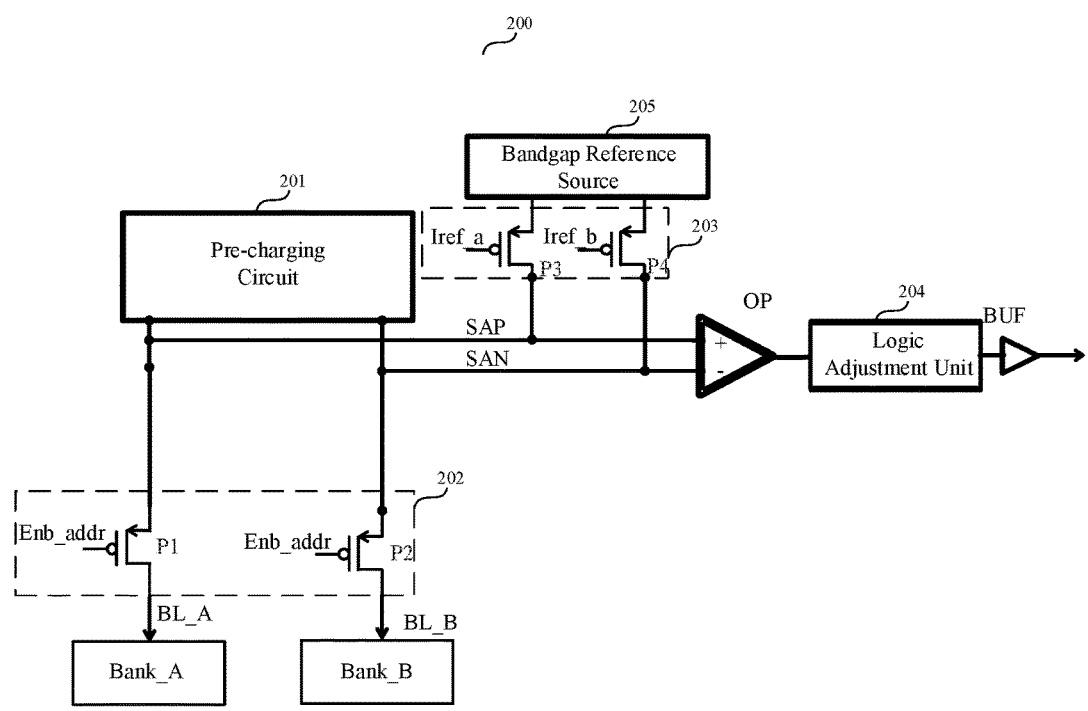
FIG. 3 illustrates a schematic structural diagram of another exemplary NVM consistent with various embodiments of the present disclosure.

FIG. 3 illustrates a schematic diagram of another exemplary NVM consistent with various embodiments of the present disclosure. In the following, the detailed embodiments of the NVM 200 will be described with reference to both FIG. 2 and FIG. 3.

In one embodiment, the NVM 200 may also include a logic adjustment unit 204. The logic adjustment unit 204 may be configured to adjust the output signal (not shown) of the sense amplifier OP based on the first word-line signal $I_{ref\_A}$ and the second word-line signal $I_{ref\_B}$.

When the reference current $I_{ref}$ is controlled to be connected to the first input terminal of the sense amplifier OP and thus flow into the first bit-line BL_A, the sense amplifier OP may output a first logic voltage level, e.g. a high voltage level, corresponding to the first voltage SAP greater than the second voltage SAN; similarly, the sense amplifier OP may output a second logic voltage level, e.g. a low voltage level, corresponding to the first voltage SAP small than or equal to the second voltage SAN. When the reference current $I_{ref}$ is controlled to be connected to the second input terminal of the sense amplifier OP and thus flow into the second bit line BL_B, the logic adjustment unit 204 may adjust the output of the sense amplifier OP to the second logic voltage level, corresponding to the first voltage SAP greater than the second voltage SAN; similarly, the logic adjustment unit 204 may adjust the output of the sense amplifier OP to the first logic voltage level, corresponding to the first voltage SAP small than or equal to the second voltage SAN.

In one embodiment, the first input terminal of the sense amplifier OP may be the positive input terminal of the sense amplifier OP. In other embodiment, the first input terminal of the sense amplifier OP may be the negative input terminal of the sense amplifier OP. Whether the first input terminal of the sense amplifier OP is the positive input terminal or the negative input terminal may merely affect the logic of the output signal of the sense amplifier OP, and the logic adjustment unit 204 may further adjust the output signal to the desired logic of the device.

In one embodiment, the NVM 200 may also include a buffer BUF. The buffer BUF may be configured to improve the driving ability of the adjusted output signal of the sense amplifier OP. In other embodiments, the NVM may not include any buffer.

In one embodiment, the first selection circuit 202 may include a first selection device and a second selection device. In other embodiment, the first selection circuit 202 may have other structures and may include a deferent number of selection devices.

Further, the control terminal of the first selection device may be used to receive the address enable signal Enb_addr, the input terminal of the first selection device may be coupled to the first output terminal of the pre-charging circuit 201, and the output terminal of the first selection device may be coupled to the first bit-line BL_A. The control terminal of the second selection device may receive the address enable signal Enb_addr, the input terminal of the second selection device may be coupled to the second output terminal of the pre-charging circuit 201, and the output terminal of the second selection device may be coupled to the second bit-line BL_B.

In one embodiment, the first selection device may be a first PMOS transistor P1 and the second selection device may be a second PMOS transistor P2.

Further, the voltage of the bit-line of the high-speed NVM 200 is usually at a high voltage level, and thus the first selection device and the second selection device are usually PMOS transistors. In other embodiments, as long as the requirements of the voltage of the bit-lines of the NVM are satisfied, the first selection device and/or the second selection device may be other types of switching devices or a combination of several switching devices.

Moreover, in one embodiment, the second selection circuit 203 may include a third selection device (not labeled) and a fourth selection device (not labeled). In other embodiment, the second selection circuit 203 may have other structures and may include a deferent number of selection devices.

Further, the control terminal of the third selection device may be used to receive the first word-line signal $I_{ref\_A}$, the input terminal of the third selection device may be used to receive the reference current $I_{ref}$, and the output terminal of the third selection device may be coupled to the first input terminal of the sense amplifier OP. The control terminal of the fourth selection device may be used to receive the second word-line signal $I_{ref\_B}$, the input terminal of the fourth selection device may be used to receive the reference current $I_{ref}$, and the output terminal of the fourth selection device may be coupled to the second input terminal of the sense amplifier OP.

In one embodiment, the third selection device may be a third PMOS transistor P3 and the fourth selection device may be a fourth PMOS transistor P4.

Further, in one embodiment, the third selection device and the fourth selection device may be both PMOS transistors. In other embodiments, the third selection device and/or the fourth selection device may also be other types of switching devices or a combination of several switching devices. For example, the switching devices may be NMOS transistors. That is, the third selection device and/or the fourth selection device may be NMOS transistors.

In one embodiment, when the first word-line signal $I_{ref\_A}$ controls the third selection device to be turned on, the reference current $I_{ref}$ may be connected to the first input terminal of the sense amplifier OP and flow into the first bit-line BL_A, and thus the data information stored in the first array bank Bank_A may be read out. When the second word-line signal $I_{ref\_B}$ controls the fourth selection device to be turned on, the reference current $I_{ref}$ may be connected to the second input terminal of the sense amplifier OP and flow into the second bit-line BL_B, and thus the data information stored in the second array bank Bank_B may be read out. Because at a given time, data information stored in only one array bank between the first array bank Bank_A and the second array bank Bank_B may be read out, the third selection device and the fourth selection device may not be both turned on during the read operation.

Further, when reading out the data information stored in the first array bank Bank_A, the address enable signal Enb_addr may be at a low voltage level so that the first PMOS transistor P1 and the second PMOS transistor P2 may be turned on. As such, the first output terminal of the pre-charging circuit 201 may be connected to the first bit-line BL_A and the second output terminal of the pre- charging circuit 201 may be connected to the second bit-line BL_B. Moreover, the first word-line signal $T_{ref\_A}$ may also be at a low voltage level so that the third PMOS transistor P3 may be turned on; in the meantime, the second word-line signal $I_{ref\_B}$ may be at a high voltage level so that the fourth PMOS transistor P4 may be turned off. As such, the reference current $I_{ref}$ may be connected to the first input terminal of the sense amplifier OP through the second selection circuit 203.

Further, in one embodiment, it is assumed that the pre- charging circuit 201 may charge the first bit-line BL_A and the second bit-line BL_B to 1 V. That is, both the first voltage SAP and the second voltage SAN may be 1 V. In addition, the reference current is assumed to be 2 µA. When the data information stored in the first array bank Bank_A is "1" or "0", the detailed operation process to read the information stored in the first array bank Bank_A of the NVM 200 may be referred to the descriptions in previous embodiments.

Further, in one embodiment, the NVM 200 may also include a bandgap reference source 205. The bandgap ref- erence source 205 may be configured to provide the refer- ence current $I_{ref}$.

In one embodiment, the NVM 200 may be a flash memory or an electrically erasable programmable read-only memory (EEPROM). In other embodiments, the NVM may also be any other appropriate NVM.

Figure 4:
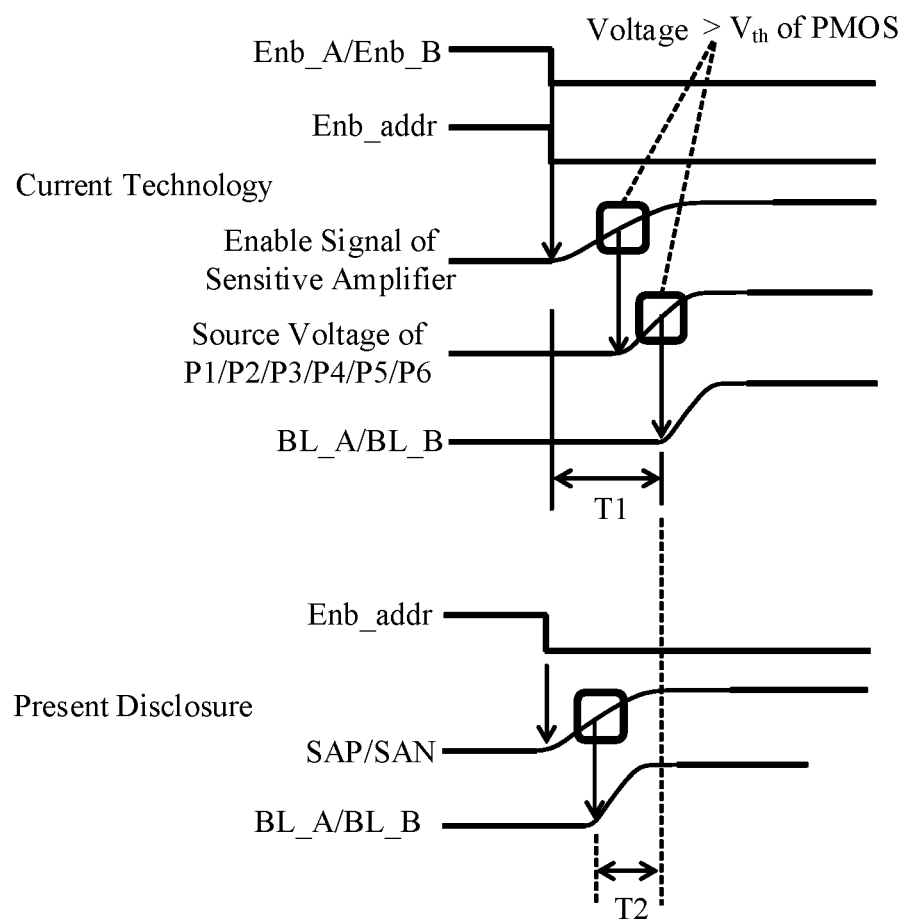
FIG. 4 illustrates a schematic comparison between the bit-line pre-charging time of conventional NVMs and the bit-line pre-charging time of NVMs according to various embodiments of the present disclosure.

Further, FIG. 4 illustrates a schematic comparison between the bit-line pre-charging time of NVMs according to exiting technology and the bit-line pre-charging time of NVMs according to various embodiments of the present disclosure. Specifically, FIG. 4 may illustrate a comparison between the signal of the NVM shown in FIG. 1 and the signal of the NVM shown in FIG. 2 during data reading operation.

Referring to FIG. 4, The time period T1 may be the non-effective waiting time for the pre-charging circuit 10 (referring to FIG. 1) to charge the first bit-line BL_A and the second bit-line BL_B. The time period T2 may be the saved time for the pre-charging circuit 201 (referring to FIG. 2) to charge the first bit-line BL_A and the second bit-line BL_B as compared to the time period T1. Therefore, based on the comparison result illustrated in FIG. 4, the disclosed NVM may effectively reduce the data read time of the NVM by reducing the pre-charging time.

According to the disclosed NVM, the NVM may include a first array bank and a second array bank. The first array bank and the second array bank may each include a plurality of memory cells. The first array bank may be coupled to a first bit-line and the second array bank may be coupled to a second bit-line. When one of the first array bank and the second array bank is controlled to be read out, the other one of the first array bank and the second array bank is used as a pseudo array bank.

Further, the NVM may also include a pre-charging circuit, a first selection circuit, a sense amplifier, and a second selection circuit.

In response to an address enable signal that enables pre-charging the first bit-line and the second bit-line, the first selection circuit may be configured to connect a first output terminal of the pre-charging circuit to the first bit-line and a second output terminal of the pre-charging circuit to the second bit-line to allow the pre-charging circuit charge the first bit-line and the second bit-line. Alternatively, in response to an address enable signal that disables pre- charging the first bit-line and the second bit-line, the first selection circuit may be configured to disconnect the connection between the first output terminal of the pre-charging circuit and the first bit-line and the connection between the second output terminal of the pre-charging circuit and the second bit-line.

The first input terminal of the sense amplifier may be coupled to the first output terminal of the pre-charging circuit to receive a first voltage, and the second input terminal of the sense amplifier may be coupled to the second output terminal of the pre-charging circuit to receive a second voltage.

Further, the sense amplifier may be configured to compare the first voltage with the second voltage and thus obtain a comparison result. The comparison result may indicate the information stored in the first array bank or in the second array bank.

The second selection circuit may be configured to control the reference current to be connected to either the first input terminal or the second terminal of the sense amplifier based on the first word-line signal and the second word-line signal. A reference current is connected to the first input terminal and the second input terminal of the sense amplifier through the structurally-symmetric second selection circuit. Moreover, the reference current flows only into the active array bank between the first array bank and the second array bank. Specifically, the active array bank between the first array bank and the second array bank refers to the array bank in the first array bank and the second array bank that needs to be read out. That is, at a given time, the reference current may flow only into the first array bank or only into the second array bank depending on which array bank needs to be read out.

Compared to conventional NVMs, the disclosed NVM eliminates a selection circuit used to select the array bank to be read out from the first array bank and the second array bank, and only retain a selection circuit for selectively pre-charging the first bit-line and/or the second bit-line. In conventional NVMs, the array bank selection circuit and the bit-line pre-charging selection circuit are arranged in series in the electric circuit diagram of the NVMs. Therefore, the selection devices in the electric circuit of conventional NVMs may include multiple levels. According to the disclosed NVMs, by eliminating the array bank selection circuit from the pre-charging circuit path, the number of the levels of the selection devices (such as PMOS transistors) in the disclosed NVM may be reduced by one. Accordingly, the pre-charging process for the first bit-line and the second bit-line may be significantly improved, and the bit-line pre-charging time in the disclosed NVM may be reduced by approximately 0.7 ns to 1.2 ns. For a memory with a typical data read time of about 10 ns, the reduced portion of the bit-line pre-charging time is approximately 10% of the data read time. Therefore, the data read time of the disclosed NVM may be effectively reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A nonvolatile memory (NVM), comprising:
    a first array bank and a second array bank, each including a plurality of memory cells, wherein the first array bank is coupled to a first bit-line, and the second array bank is coupled to a second bit-line;
    a pre-charging circuit;
    a first selection circuit, wherein, in response to an address enable signal to pre-charge the first bit-line and the second bit-line, the first selection circuit is configured to connect a first output terminal of the pre-charging circuit to the first bit-line and a second output terminal of the pre-charging circuit to the second bit-line, and in response to an address enable signal to disable pre-charging the first bit-line and the second bit-line, the first selection circuit is configured to disconnect the first bit-line from the first output terminal of the pre-charging circuit and the second bit-line from the second output terminal of the pre-charging circuit;
    a sense amplifier, including a first input terminal to receive a first voltage from the first output terminal of the pre-charging circuit and a second input terminal to receive a second voltage from the second output terminal of the pre-charging circuit, and configured to compare the first voltage with the second voltage to obtain a result indicating data information stored in the first array bank or in the second array bank; and
    a second selection circuit, configured to connect a reference current to the first input terminal or the second input terminal of the sense amplifier based on a first word-line signal and a second word-line signal.

2. The NVM according to claim 1, further including:
    a logic adjustment unit configured to adjust an output signal of the sense amplifier based on the first word-line signal and the second word-line signal.

3. The NVM according to claim 2, wherein:
when the reference current is controlled to be connected to the first input terminal of the sense amplifier, the sense amplifier outputs a first logic voltage level corresponding to the first voltage greater than the second voltage, and outputs a second logic voltage level different from the first logic voltage level corresponding to the first voltage smaller than or equal to the second voltage; and
when the reference current is controlled to be connected to the second input terminal of the sense amplifier, the sense amplifier outputs the second logic voltage level corresponding to the first voltage greater than the second voltage, and outputs the first logic voltage level corresponding to the first voltage smaller than or equal to the second voltage.

4. The NVM according to claim 2, further including:
    a buffer configured to improve driving ability of the adjusted output signal of the sense amplifier.

5. The NVM according to claim 1, wherein the first selection circuit includes:
    a first selection device with a control terminal to receive the address enable signal, an input terminal coupled to the first output terminal of the pre-charging circuit, and an output terminal coupled to the first bit-line; and
    a second selection device with a control terminal to receive the address enable signal, an input terminal coupled to the second output terminal of the pre-charging circuit, and an output terminal coupled to the second bit-line.

6. The NVM according to claim 5, wherein:
the first selection device is a first P-type metal-oxide-semiconductor (PMOS) transistor; and
the second selection device is a second PMOS transistor.

7. The NVM according to claim 1, wherein the second selection circuit includes:

a third selection device with a control terminal to receive the first word-line signal, an input terminal to receive the reference current, and an output terminal coupled to the first input terminal of the sense amplifier; and
a fourth selection device with a control terminal to receive the second word-line signal, an input terminal to receive the reference current, and an output terminal coupled to the second input terminal of the sense amplifier.

8. The NVM according to claim 7, wherein:
when the first word-line signal turns on the third selection device, the reference current flows into the first input terminal of the sense amplifier, and the first array bank is controlled to be read out; and
when the second word-line signal turns on the fourth selection device, the reference current flows into the second input terminal of the sense amplifier, and the second array bank is controlled to be read out.

9. The NVM according to claim 7, wherein:
the third selection device is a third PMOS transistor; and
the fourth selection device is a fourth PMOS transistor.

10. The NVM according to claim 1, further including:
a bandgap reference source configured to provide the reference current.

11. The NVM according to claim 1, including a flash memory or an electrically erasable programmable read-only memory (EEPROM).

12. A method for reading data information stored in the NVM according to claim 1, the method comprising:
pre-charging the first bit-line and the second bit-line by sending in an address enable signal to the first selection circuit;
sending in a first word-line signal and a second word-line signal to the second selection circuit to connect the reference current to the first input terminal or the second input terminal of the sense amplifier; and
comparing the first voltage received by the first input terminal of the sense amplifier with the second voltage received by the second input terminal of the sense amplifier to obtain a comparison result indicating the data information stored in the first array bank or in the second array bank depending on the first word-line signal and the second word-line signal.

13. The method for reading data information stored in the NVM according to claim 12,
wherein the data information to be read out is stored in the first array bank, and wherein:
the first word-line signal and the second work-line signal sent to the second selection circuit connect the reference current to the first input terminal of the sense amplifier.

14. The method for reading data information stored in the NVM according to claim 12,
wherein the data information to be read out is stored in the second array bank, and
wherein:
the first word-line signal and the second work-line signal sent to the second selection circuit connect the reference current to the second input terminal of the sense amplifier.

15. The method for reading data information stored in the NVM according to claim 13,
wherein:
when the data information stored in the first array bank is "1", an current flowing in the first bit-line is greater than the reference current, and accordingly, the first voltage is pulled down to be lower than the second voltage; and
when the data information stored in the first array bank is "0", an current flowing in the first bit-line is less than the reference current, and accordingly, the first voltage is raised up to be greater than the second voltage.

16. The method for reading data information stored in the NVM according to claim 14,
wherein:
when the data information stored in the second array bank is "1", an current flowing in the second bit-line is greater than the reference current, and accordingly, the second voltage is pulled down to be lower than the first voltage; and
when the data information stored in the second array bank is "0", an current flowing in the second bit-line is less than the reference current, and accordingly, the second voltage is raised up to be greater than the first voltage.

17. The method for reading data information stored in the NVM according to claim 12, further including:
adjusting an output signal of the sense amplifier through a logic adjustment unit.

18. The method for reading data information stored in the NVM according to claim 17, further including:
improving the driving ability of the adjusted output signal of the sense amplifier through a buffer.

19. The method for reading data information stored in the NVM according to claim 12,
wherein:
the reference current is generated by a bandgap reference source.

* * * * *